(12) United States Patent
Parikh et al.

(10) Patent No.: US 10,498,371 B1
(45) Date of Patent: Dec. 3, 2019

(54) MULTI-CHANNEL, MULTI-BAND CONFIGURABLE RF FRONT-END ARRANGEMENT FOR WIRELESS COMMUNICATION

(71) Applicants: Nimesh D Parikh, Somerset, NJ (US); Claus Muschallik, Singapore (SG); MH Gan, Singapore (SG); Aaron Do, Singapore (SG)

(72) Inventors: Nimesh D Parikh, Somerset, NJ (US); Claus Muschallik, Singapore (SG); MH Gan, Singapore (SG); Aaron Do, Singapore (SG)

( * ) Notice: Subject to any disclaimer, the term of this patent is extended or adjusted under 35 U.S.C. 154(b) by 0 days.

(21) Appl. No.: 15/986,913

(22) Filed: May 23, 2018

Related U.S. Application Data

(60) Provisional application No. 62/511,213, filed on May 25, 2017.

(51) Int. Cl.
| | |
|---|---|
| *H04B 1/00* | (2006.01) |
| *H04B 1/26* | (2006.01) |
| *H04B 1/18* | (2006.01) |
| *H03D 7/16* | (2006.01) |
| *H04L 5/14* | (2006.01) |
| *H04B 1/48* | (2006.01) |
| *H04W 72/04* | (2009.01) |

(52) U.S. Cl.
CPC .......... *H04B 1/0096* (2013.01); *H03D 7/161* (2013.01); *H04B 1/006* (2013.01); *H04B 1/0075* (2013.01); *H04B 1/18* (2013.01); *H04B 1/26* (2013.01); *H04B 1/48* (2013.01); *H04L 5/14* (2013.01); *H04W 72/0453* (2013.01)

(58) Field of Classification Search
CPC ........ H04B 2001/0416; H04W 52/146; H04W 52/241; H04W 52/242; H04W 52/245; H04W 52/288; H04W 52/367
USPC .......................................................... 455/42
See application file for complete search history.

(56) References Cited

U.S. PATENT DOCUMENTS

| | | | |
|---|---|---|---|
| 8,725,085 | B2 | 5/2014 | Darabi et al. |
| 8,995,312 | B2 | 3/2015 | Balijapalli et al. |
| 9,564,932 | B1 | 2/2017 | Pack et al. |
| 9,577,954 | B2 | 2/2017 | Williams et al. |
| 9,825,653 | B2 | 11/2017 | Imana et al. |

(Continued)

OTHER PUBLICATIONS

Mueck, Markus Dominik, et al., "Spectrum Sharing: Licensed Shared Access (LSA) and Spectrum Access System (SAS)", Intel White Paper, Oct. 2015, pp. 1-26.

*Primary Examiner* — Ajibola A Akinyemi
(74) *Attorney, Agent, or Firm* — Wendy W. Koba

(57) ABSTRACT

An RF front-end system is formed to include tunable frequency converters within the transmit and receive sections of each channel, allowing for conventional, limited-bandwidth wireless devices to transmit and receive a broad range of frequencies. Both the transmit and receive sections use superheterodyne frequency conversion to provide the translation between the limited frequency band associated with conventional wireless devices and wide frequency band (e.g., between about 100 MHz and 7000 MHz) approved for wireless communication. By virtue of using a local oscillator that can be widely tuned over the complete available frequency spectrum, the up-converted signals used for transmission can be expanded over this wider frequency selection.

7 Claims, 5 Drawing Sheets

(56) References Cited

U.S. PATENT DOCUMENTS

| | | | |
|---|---|---|---|
| 2008/0062919 A1* | 3/2008 | Chen | H04W 16/14 370/329 |
| 2011/0039503 A1 | 2/2011 | Hu et al. | |
| 2011/0053637 A1 | 3/2011 | Filipovic et al. | |
| 2014/0177484 A1 | 6/2014 | Balijapalli et al. | |
| 2015/0119115 A1* | 4/2015 | Bagger | H04B 1/0057 455/571 |
| 2015/0333761 A1* | 11/2015 | Leung | H04B 1/005 331/48 |
| 2016/0381649 A1* | 12/2016 | Anthony | H03F 3/24 455/127.2 |
| 2017/0195961 A1 | 7/2017 | Chakraborty et al. | |

\* cited by examiner

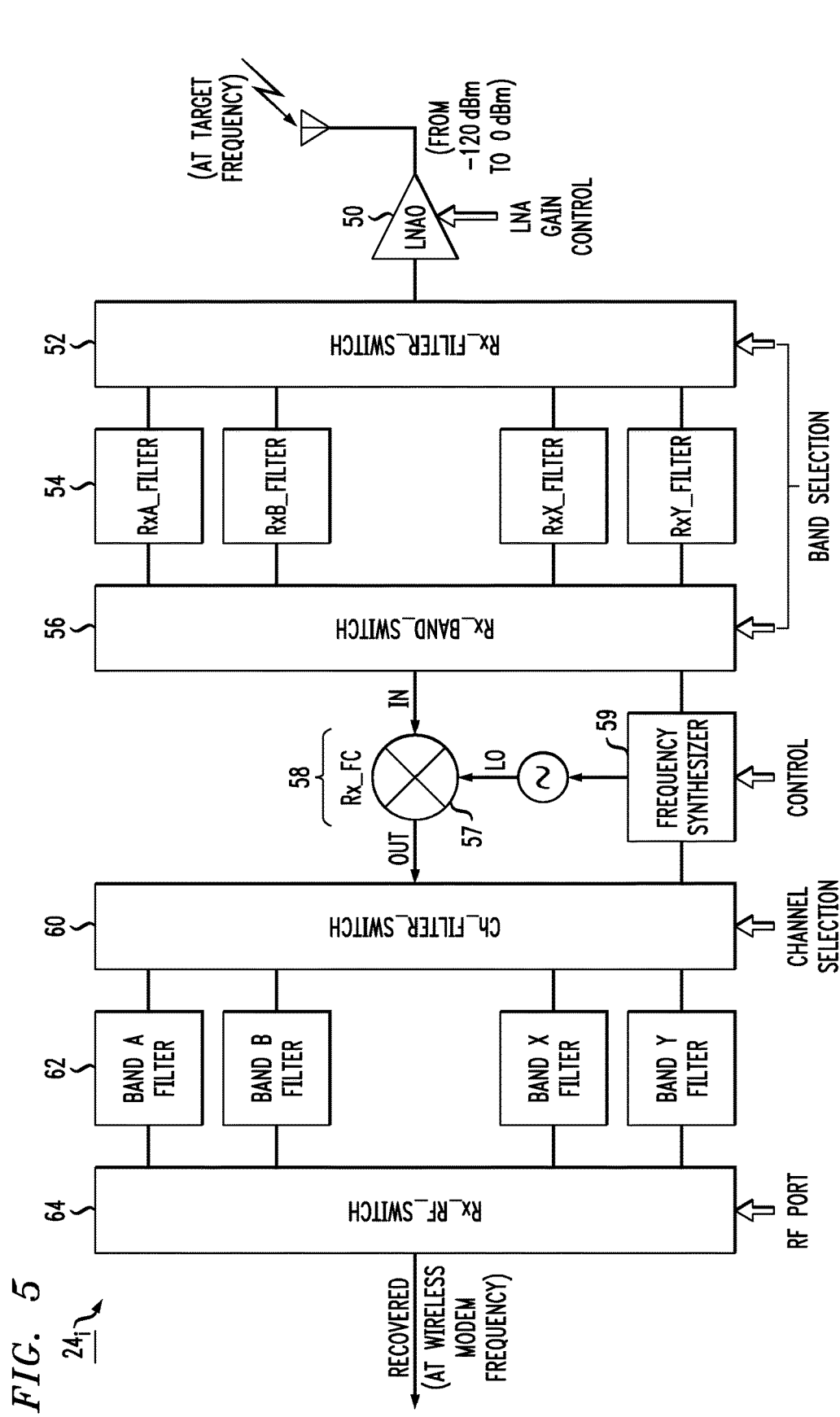

MULTI-CHANNEL, MULTI-BAND CONFIGURABLE RF FRONT-END ARRANGEMENT FOR WIRELESS COMMUNICATION

CROSS-REFERENCE TO RELATED APPLICATIONS

This application claims the benefit of U.S. Provisional Application No. 62/511,213, filed May 25, 2017 and herein incorporated by reference.

TECHNICAL FIELD

The present invention relates to an RF front-end arrangement for wireless communication and, more particularly, to an RF front-end arrangement that is configured to operate as a multi-channel, multi-band component that is able to efficiently utilize a wide range of available frequency bands.

BACKGROUND OF THE INVENTION

Advances in wireless technology have led to the emergence of a wide range of wireless and radio access technologies. Because of the time and cost involved in developing wireless systems, today's manufacturers typically focus on implementations using the globally-harmonized public frequency bands (which represent only a fraction of the total frequency bands available for this type of communication). Indeed, studies conducted by regulatory bodies in various countries have revealed that most of the private radio frequency spectrum is inefficiently utilized as a result of the unavailability of wireless equipment that functions properly in these bands.

Developers of modern wireless communication systems are working towards enabling the operation of these systems within a wide frequency spectrum. A broad frequency range of operation and configurability of operating parameters for these wide frequency systems is contingent upon the design of an RF front end (i.e., the interface between the antenna and the transmitter/receiver) that functions over a wide frequency spectrum.

SUMMARY OF THE INVENTION

The present invention addresses the limitations of RF front-end systems utilized in prior art wireless communication systems, taking the form of an RF front-end arrangement that is configured to operate as a multi-channel, multi-band component that is able to efficiently utilize a wide range of available frequency bands.

In accordance with the present invention, an RF front-end system is formed to include tunable, wideband frequency converters within the transmit and receive sections of each channel, allowing for conventional, limited-bandwidth wireless devices to transmit and receive a broad range of frequencies. Both the transmit and receive sections use superheterodyne frequency conversion to provide the translation between the limited frequency band associated with conventional wireless devices and wide frequency band (e.g., between about 100 MHz and 7000 MHz) approved for wireless communication. By virtue of using a local oscillator that can be widely tuned over the complete available frequency spectrum, the frequency-converted signals used for transmission can be expanded over this wider frequency selection.

Each channel is configurable across a range of operating parameters, based on inputs from a monitoring and control module. In particular, signals from the control module are used in conjunction with a frequency synthesizer to "tune" the local oscillator (LO) frequency selections associated with each channel. A switching section provides control information to a transmit/receive switch to operate a given channel in either Time Division Duplex (TDD) or Frequency Division Duplex (FDD) mode, as well as providing selection of an appropriate transceiver channel. The control module can provide inputs for the RF power output or the low noise amplifier (LNA) gain in the receive section of each channel.

An exemplary embodiment of the present invention takes the form of an RF front-end system comprising an RF circuit for providing tunable frequency conversion, signal filtering, and signal amplification between a wireless communication device operating on a public spectrum (for example, WiFi in accordance with IEEE 802.11) and a private wireless communication network operating on a licensed spectrum, and a controller for specifically configuring the RF circuit to tune conversions between the public frequency band and private, licensed frequencies. The RF circuit particularly comprises a plurality of N transceiver channels, each transceiver channel comprising a transmit section and a receive section, with each transmit section configured to up-convert a narrowband wireless communication signal to one selected band of an associated plurality of Y defined frequency bands within the wideband wireless communication network and each receive section configured to down-convert a received signal at the one selected band of the associated plurality of Y defined frequency bands into the narrowband frequency, wherein the definition of the Y defined frequency bands and the selection of the one selected band are provided by control signals from the controller.

Other and further aspects of the present invention will become apparent during the course of the following discussion and by reference to the accompanying drawings.

BRIEF DESCRIPTION OF THE DRAWINGS

Referring now to the drawings,

FIG. 5 is a detailed diagram of an exemplary channel receive section formed in accordance with the present invention.

DETAILED DESCRIPTION

Figure 1:
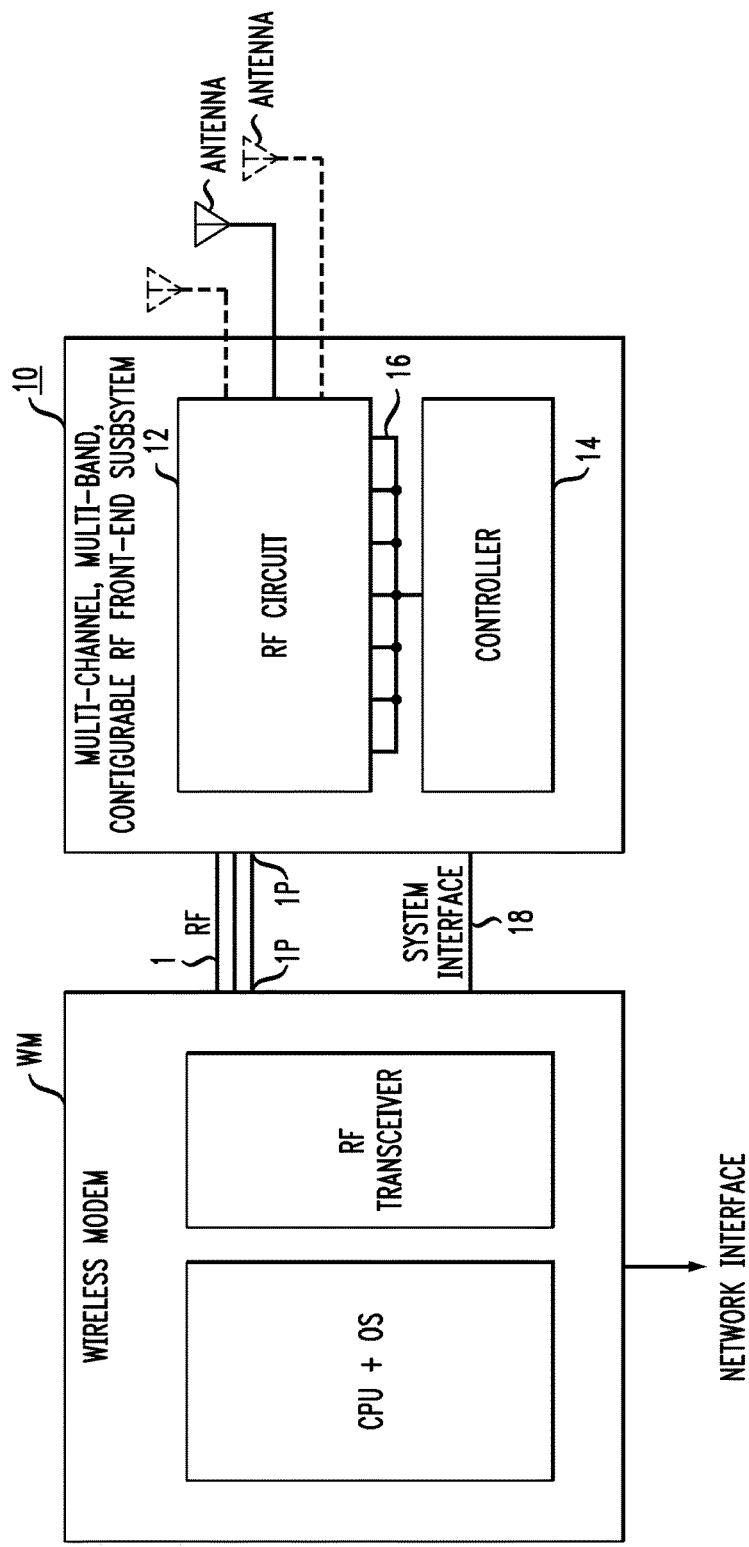
FIG. 1 is a high-level block diagram of a typical application for a multi-channel, multi-band, configurable RF front-end system formed in accordance with the present invention.

FIG. 1 illustrates an exemplary application for the configurable RF front-end system of the present invention. Here, a multi-channel, multi-band, configurable RF front-end system 10 is shown as an interface between a conventional (prior art) wireless modem WM and an antenna ANT.

Wireless modem WM shows a communication path via a network interface to wireless devices (such as smartphones, tablets, and the like) that are involved in wireless communication. As mentioned above, the ubiquitous nature of wireless communication devices results in manufacturers minimizing the number of different standards with which these devices are compatible. While this makes sense from a manufacturing point of view, the reality is that the spectrum over which these devices operate is only a small fraction of the total available frequency range.

The premise of the present invention is to make use of a larger portion of the available spectrum by converting transmission at the limited RF band associated with the manufactured communication devices to the larger frequency range permitted by governmental agencies to be carriers of wireless signals. An RF front-end system formed in accordance with the present invention provides the tunable conversion from a modem's original RF band to a different target frequency range and, similarly, the inventive RF front-end system functions to receive incoming signals broadcast over a different target frequency range back into the spectral band associated with the modem's original band. As will be described in detail below, a multi-channel, multi-band configurable RF front-end system 10 formed in accordance with the present invention comprises an RF circuit 12 that provides tunable frequency conversion, signal amplification, and filtering functions for the multiple MIMO channels and bands supported by the system ("MIMO" a term of art understood as multiple-input and multiple-output). Also included in RF front-end system 10 is a controller 14 that provides control for tuning the frequencies of the various LOs, as well as signals for controlling various switches and other elements within RF circuit 12 via a parallel communication bus 16. Controller 14 also supports bidirectional communication with wireless modem WM over a system interface 18.

Operating in the "transmit" direction, a communication signal from wireless modem WM is provided as an input to RF front-end system 10 via an RF signal path 1. In actual implementation, it is contemplated that there will be a plurality of RF MIMO signal ports 1P terminating along both system 10 and wireless modem WM. The communication signal is then converted via a mixer performing heterodyne frequency conversion to a selected target frequency spectrum and coupled into the proper antenna for broadcast. The tunable LO frequency is set by commands from controller 14 (described in detail below). In the "receive" direction, an incoming communication signal (operating at a target frequency) is coupled via one of the antennas into the receive section of RF circuit 12. The received signal is then amplified, filtered and converted to a frequency used by the receiving section of wireless modem WM. Controller 14 interacts with each of the transmit and receive frequency converters in each channel and defines the specific LO frequency to be used in each, thereby permitting a plurality of channels to operate with a plurality of different frequency bands. This flexibility allows the FDD communication system implementation of the present invention to use different frequencies for upstream and downstream communication. The details of these various attributes of the present invention will now be discussed in detail below.

Figure 2:
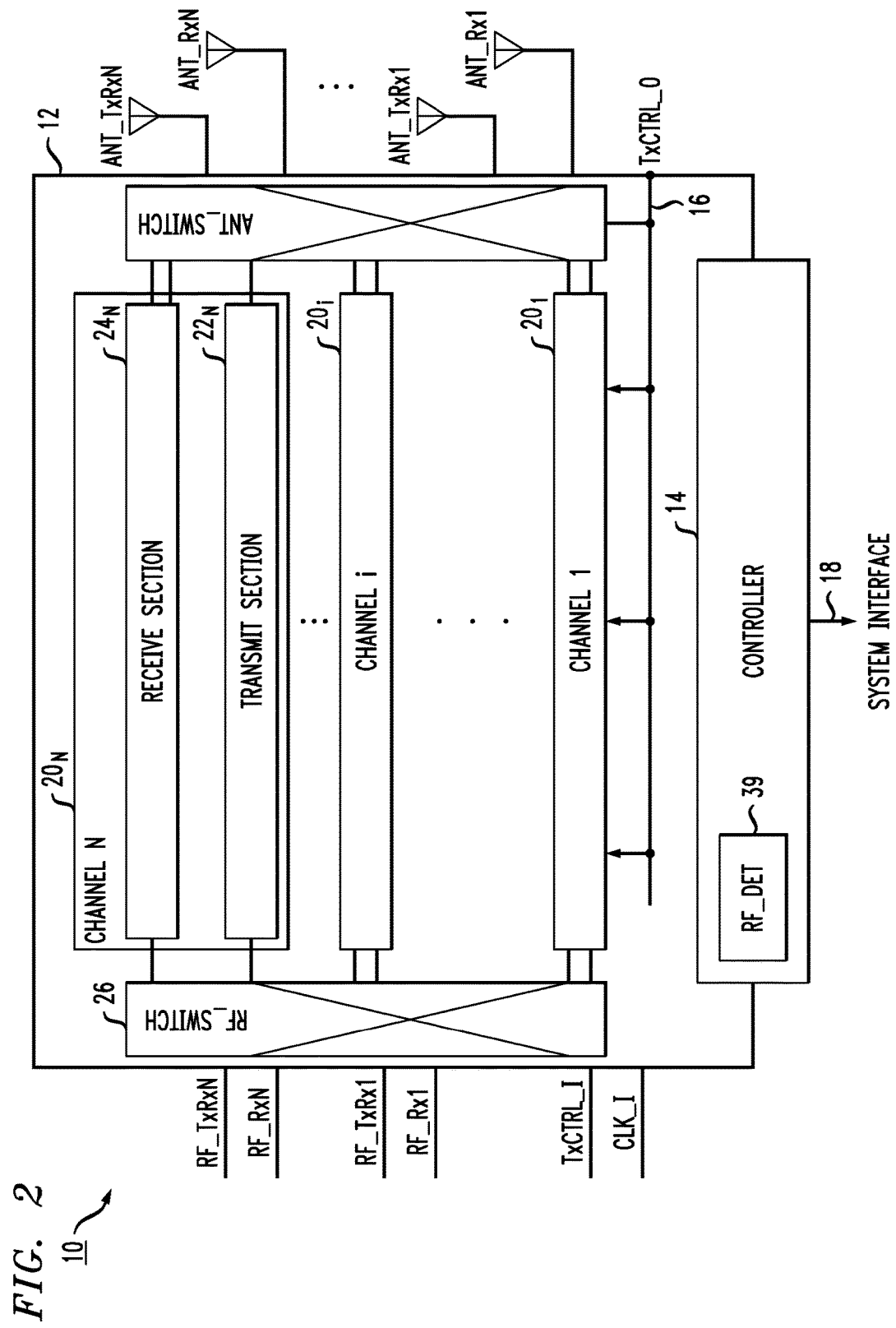
FIG. 2 is a simplified diagram of a multi-channel, multi-band configurable RF front-end system formed in accordance with the present invention.

FIG. 2 is a diagram illustrating in slightly more detail various elements forming RF circuit 12 and controller 14 of RF front-end system 10. In particular, RF circuit 12 is shown as comprising a plurality of N channels 20 (shown as channels $20_1, 20_2, \ldots, 20_N$ in FIG. 2). Each channel $20_i$ is formed to include its own transmit section $22_i$ and receive section $24_i$, with transmit section $22_N$ and receive section $24_N$ particularly illustrated in FIG. 2. As described below, each channel is capable of using multiple, different frequency bands for bidirectional communication, under the control of commands from controller 14. In a preferred embodiment of the present invention, each channel 20 is configured to operate over multiple target frequencies between 100 MHz and 7000 MHz. Each individual channel may be configured for varying channel size (depending on the number of channels included in the system) so that the entire available spectrum is used most efficiently. In one embodiment an RF power detector 39 may be used to control the switching between "transmit" and "receiver" in the TDD mode of operation. In particular, power detector 39 is configured to detect the RF signal threshold along an incoming signal from the wireless modem. The threshold value is configurable over a given range (say, −30 dBm to +30 dBm) and is used to determine which direction the signal is propagating and controlling between transmit and receive accordingly.

An RF switch 26 is included in RF circuit 12 and used to provide communication between a wireless modem WM and a "selected" channel 20. The selection is provided via a "channel select" control signal from controller 14, as described in detail below. Additionally, RF switch 26 may be configured for operation in either TDD MIMO mode or FDD MIMO mode (again, a "mode" control signal from controller 14 is used to properly configure RF switch 26 based on this determination). In TDD mode, a specific channel utilizes the same frequency for transmit and receive, with specific time intervals controlling the sequence between the two (and perhaps using RF power detector 39). In FDD mode, the transmit and receive sections of the channel utilize different frequencies and, therefore, operate at the same time. In the TDD mode, a single port is required and in FDD mode a pair of antennas are required. An antenna switch 28 is used to provide communication between a selected channel and an appropriate antenna (an "antenna select" control signal from controller 14 is used to also provide this signal), ensuring that the proper antennas are engaged for FDD communication.

Figure 3:
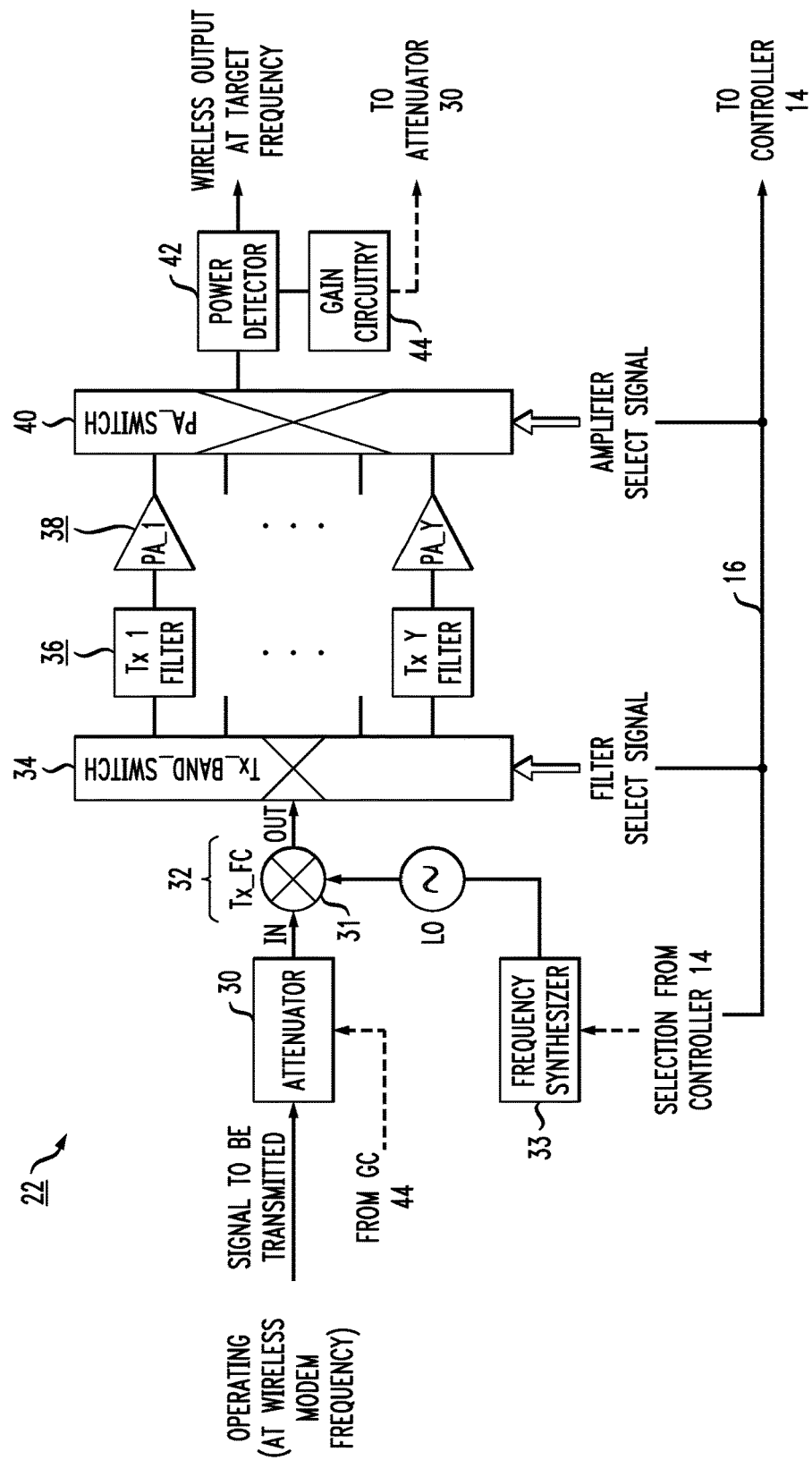
FIG. 3 is a detailed diagram of an exemplary channel transmit section formed in accordance with the present invention.

FIG. 3 is a detailed illustration of an exemplary transmit section $22_i$ of a channel $20_i$ formed as part of RF front-end system 10 of the present invention. An RF communication signal from a wireless modem (not shown) is first passed through an attenuator 30, which is configured to control the power level of the RF signal so that transmit section 22 operates at optimum efficiency (and is discussed below in the description of the output power detector and gain control circuit). The power-controlled RF signal is then applied as a first input to a tunable wideband frequency converter 32. A local oscillator (LO) signal operating at a selected frequency is applied as a second input to tunable wideband frequency converter 32. In accordance with the present invention, a frequency synthesizer 33 is used to create the desired LO signal, which is selected from over a relatively wide frequency band (for example, 50 Mz-6000 MHz). Functioning as a superheterodyne mixer, wideband frequency converter 32 provides an output signal ("OUT") at a selected target frequency representing the addition or subtraction of the two input frequencies.

Figure 4:
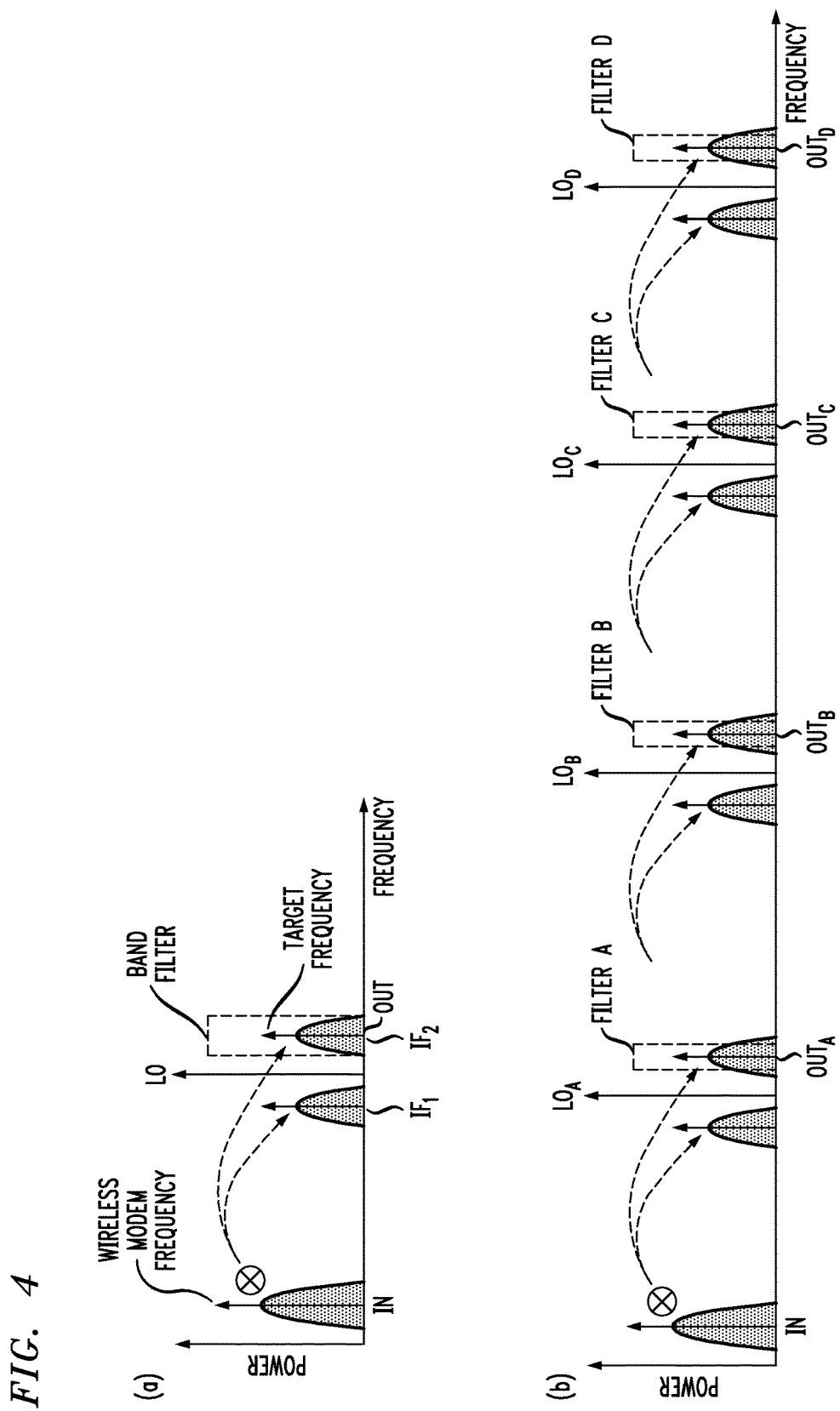
FIG. 4 is a diagram explaining the use of a frequency synthesizer to create a set of specific frequency bands for a given transceiver channel, portion (a) of FIG. 4 showing a single conversion and portion (b) showing a set of frequency conversions.

FIG. 4 depicts the details of this conversion process performed by tunable wideband frequency converter 32, which comprises a mixer 31 and frequency synthesizer 33. Portion (a) of FIG. 4 illustrates the basic principle of heterodyne frequency conversion, where the input signal (denoted "IN" in FIG. 4) is combined with a specific frequency local oscillator (denoted "LO" in FIG. 4). The input signal is operating at a first frequency commonly used by wireless communication devices, shown as $f_{IN}$ in this illustration. Input signal IN and local oscillator LO combine in a well-known manner and produce as an output signal (denoted "OUT" in FIG. 4) a pair of "intermediate frequency" signals below and above the LO frequency, shown as $IF_1$ and $IF_2$ in portion (a) of FIG. 4. For the purposes of the present invention, one of the IF signals, here $IF_2$, is defined as the selected target frequency and thereafter used as frequency for output signal OUT.

Portion (b) of FIG. 4 illustrates the extension of this principle of operation to the situation of the present invention where a set of different LO signals are available for use in the conversion process. Again, for the purposes of discussion, a set of four LO signals (denoted $LO_A$, $LO_B$, $LO_C$, and $LO_D$) are shown in portion (b), where these four signals are created by frequency synthesizer 33 as directed by controller 14. Thus, in this example the associated channel comprises four separate frequency bands: Band A, Band B, Band C, and Band D. Other channels within system 10 will utilize other unique sets of bands such that the multi-channel, multi-band configurable RF front-end system of the present invention provides conversion over a relatively large frequency range.

Looking closely at portion (b) of FIG. 4, any one of the frequencies $LO_A$, $LO_B$, $LO_C$, and $LO_D$ may possibly be mixed with a given input signal IN to create an output signal OUT at one of a set of four target band frequencies related to the four LO frequencies. The four output signals are shown in portion (b) as being any one of $OUT_A$, $OUT_B$, $OUT_C$, or $OUT_D$. A processing module within controller 14 performs the function of selecting a particular target frequency for transmission (say, band "C"), and then uses that identity to properly set the remainder of the switches within transmit section $22_i$, as described below, to ensure that the correct filters and amplifiers are used to create the final output signal.

In accordance with the present invention, a plurality of Y different frequency bands may be assigned to each channel (where in the configuration shown in portion (b)), Y=4; Y may obviously have other values, ranging upward from 1; indeed, it is contemplated that a set of 16 different frequency bands may be employed by a specific channel). Therefore, in a system using N separate MIMO channels, with each channel able to operate at one of Y different frequency bands, the result system allows for N*Y opportunities for using the wider available frequency spectrum.

Continuing with the description of transmit section $22_i$ as shown FIG. 3, frequency-converted signal OUT (here, shown as $OUT_C$) from tunable wideband frequency converter 32 is then applied as an input to a band selection switch 34. Band selection switch 34 is controlled via a signal from controller 14 to direct the frequency-converted signal $OUT_C$ into a proper band filter, selected from a plurality of band filters $36_1$ through $36_X$, to best minimize noise in the frequency band of up-converted signal. Each filter $36i$ is centered around the up-converted IF related to the LO used in the conversion process. Since the mixing operation in frequency conversion is a relatively noisy process, the band filter is used to remove stray components. Continuing with the same example, if selected target frequency band C is being used, band filter $34_C$ is selected (centered at target frequency $OUT_C$). Once filtered, the frequency-converted signal is passed through a power amplifier 36. The set of band filters 34 and power amplifiers 36 are applied as parallel inputs to an amplifier selection switch 40. Also controlled by a signal from controller 14, amplifier selection switch 40 selects the specific frequency band (e.g., "Band C") that has created the up-converted, filtered and amplified signal for transmission and provides it as an output signal. The output from amplifier selection switch 40 is then passed through a power detector 42. The measured output power is provided as an input to a gain circuit 44 which monitors the power level and adjusts the level of attenuator 30, as a feedback loop, to ensure that the power level of the transmitted wireless output signal is within an acceptable range. Each transmitter section $22_i$ is independently configured to supply output power over a dynamic range of 0 dBm to +40 dBm, with an overall gain of 20 dBm.

FIG. 5 is a detailed illustration of an exemplary receive section $24_i$ of a channel $20_i$ formed as part of RF front-end system 10 of the present invention. The operation of receive section 24 will be described from right to left, following the path of an incoming, received signal. As shown, a received signal is coupled into receive section 24 via an antenna (ANT) and passes through a wideband, low noise amplifier (LNA) 50 used to increase the incoming power level. In an exemplary implementation, wideband LNA can accept an antenna signal over the power range from −120 dBm to 0 dBm, and provides amplification up to 20 dBm. An input from controller 14 may be used to vary the gain of LNA 50.

The amplified signal produced by wideband LNA 50 is then applied as an input to a band selection switch 52, which directs the incoming signal into the proper filter 54 (based upon the set of target frequency bands used by that specific receive section $24_i$ and selected by controller 14). Thus, if there is any noise in the received signal beyond the selected set of target frequency bands associated with transceiver 12i (particularly after passing through LNA 50), they will be filtered out before performing any further signal conditioning. The band-specific, filtered signal is then directed by switch 56 into a tunable wideband frequency converter 58. As with the frequency conversion process explained in conjunction with FIG. 4, tunable wideband frequency converter 58 includes a frequency mixer 57 responsive at a first input to the filtered, received signal and utilizes $LO_C$ (from a frequency synthesizer 59, controlled by controller 14) as a second input to frequency mixer 57 to convert the target frequency associated with received signal into a frequency suitable for conventional wireless communication devices. A plurality of band filters 62 (used for harmonic suppression, for example) are controlled via a filter selection switch 60 to create an acceptable received, frequency-converted signal. As with the frequency mixing performed in transmit section 22i, the frequency conversion process in receive section 24i introduces noise into the output signal. In this direction, the conversion into a narrowband frequency utilized by a wireless modem allows for a plurality of narrow passband filters to be used in the formation of filters 62. An RF switch 64 is then used to direct this signal into the proper RF output port to be directed to a selected wireless communication device.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology and/or terminology employed herein is for the purpose of description and not of limitation. Therefore, while the embodiments herein have been described in terms of preferred embodiments, those skilled in the art will recognize that the embodiments herein can be practiced with modifications within the spirit and scope of the embodiments as described herein.

What is claimed is:

1. An RF front-end system comprising
an RF circuit for providing tunable frequency conversion, signal filtering, and signal amplification between a wireless communication device operating at a wireless modem pre-defined public RF frequency band and a private wireless communication network operating at a selected target private frequency selected from a group of target private frequency bands comprising a wide frequency private radio spectrum; and
a controller for specifically configuring the RF circuit to tune conversions between the wireless modem RF frequency and the selected target private frequency, where the RF circuit comprises
a plurality of N transceiver channels, each transceiver channel comprising a transmit section and a receive section, with each transmit section configured to convert the wireless modem pre-defined public RF frequency associated with an input wireless communication signal to one selected target private band of an associated plurality of Y defined target private frequency bands within the private wireless communication network and comprising
a tunable, wideband frequency mixer, with the incoming communication signal applied as a first input and a selected local oscillator (LO) signal applied as a second input, providing an output communication signal operating at a selected target private frequency;
a frequency synthesizer configured to generally a plurality of Y different LO frequencies, wherein the frequency synthesizer applies a selected LO frequency as the selected LO signal to the tunable, wideband frequency mixer in response to commands from the controller;
a plurality of Y frequency band filters coupled to the output of the tunable, wideband frequency mixer via a band selection switch, the band selection switch operating in response to commands from the controller to select a band filter associated with the selected LO frequency;
a plurality of Y power amplifiers disposed at the outputs of the plurality of Y frequency band filters in a one-to-one relationship; and
an amplifier selection switch coupled to the outputs of the plurality of Y power amplifiers and operating in response to commands from the controller to select the filtered, amplified, frequency converted communication signal to provide as the transmit section output signal;
and each receive section configured to convert a received signal operating at the one selected target private frequency band of the associated plurality of Y defined private frequency bands into the wireless modem pre-defined public RF frequency, wherein the definition of the Y defined private frequency bands and the selection of the one selected private frequency band are provided by control signals from the controller.

2. The RF front-end system as defined in claim 1 wherein the controller further comprises a mode selection device for switching between a time division duplex (TDD) mode of operation and a frequency division duplex (FDD) mode of operation.

3. The RF-front-end system as defined in claim 2 wherein the controller further comprises an RF power detector responsive to the input wireless communication signal to control switching between transmit and receive when operating in the TDD mode of operation.

4. The RF front-end system as defined in claim 1 wherein the transmit section of the transceiver channel further comprises a gain control arrangement comprising
an attenuator disposed at the input signal path prior to the tunable, wideband frequency converter;
a power detector disposed beyond the output of the amplifier selection switch; and
a gain control element disposed between the power detector and the attenuator, wherein the gain control element is configured to measure an output signal power level at the power detector and adjust a power level of the attenuator to maintain an acceptable output power level.

5. An RF front-end system comprising
an RF circuit for providing tunable frequency conversion, signal filtering, and signal amplification between a wireless communication device operating at a wireless modem pre-defined public RF frequency band and a private wireless communication network operating at a selected target private frequency selected from a group of target private frequency bands comprising a wide frequency private radio spectrum; and
a controller for specifically configuring the RF circuit to tune conversions between the wireless modem RF frequency and the selected target private frequency, where the RF circuit comprises
a plurality of N transceiver channels, each transceiver channel comprising a transmit section and a receive section, with each transmit section configured to convert the wireless modem pre-defined public RF frequency associated with an input wireless communication signal to one selected target private band of an associated plurality of Y defined target private frequency bands within the private wireless communication network and each receive section configured to convert a received signal operating at the one selected target private frequency band of the associated plurality of Y defined private frequency bands into the wireless modem pre-defined public RF frequency, wherein the definition of the Y defined private frequency bands and the selection of the one selected private frequency band are provided by control signals from the controller, wherein the receive section of the transceiver channel comprises
a tunable, wideband frequency mixer, with a received signal at a selected target private frequency applied as a first input and a selected LO signal applied as a second input, providing as an output a frequency-converted communication signal operating at a wireless modem frequency;
a frequency synthesizer configured to generate a plurality of Y different LO frequencies, wherein the frequency synthesizer applied a selected LO frequency as the selected LO signal to the tunable, wideband frequency mixer in response to commands from the controller;
a channel selection switch for receiving the incoming, received signal at the selected target private frequency; and
a plurality of channel filters, each defining a frequency band associated with a different channel size and controlled via a channel selection switch from the controller to pass the received signal at the selected target private frequency through a proper channel filter, the filtered signal thereafter applied as the first input to the tunable, wideband frequency converter.

6. The RF front-end system as defined in claim 5 wherein the receive section of the transceiver channel further comprises a band selection switch for receiving the output signal from the tunable, wideband frequency converter; and a plurality of narrow passband filters, each filter centered at a different target private frequency associated with the receive section, the band selection switch responsive to a command from the controller for directing the output signal into a proper narrow passband filter for noise removal and interference resistance; and an output port switch coupled to the plurality of narrow passband filters and controlled by a command signal from the controller to direct the frequency-converted received signal into a selected output RF port.

7. The RF front-end system as defined in claim 5 wherein the receive section of the transceiver channel further comprises a low noise amplifier disposed to receive an incoming wireless signal from an antenna and provide gain control at a predetermined power level.

* * * * *